(12) United States Patent
Hermann

(10) Patent No.: US 9,046,580 B2
(45) Date of Patent: *Jun. 2, 2015

(54) BATTERY THERMAL EVENT DETECTION SYSTEM UTILIZING BATTERY PACK ISOLATION MONITORING

(75) Inventor: Weston Arthur Hermann, Palo Alto, CA (US)

(73) Assignee: Tesla Motors, Inc., Palo Alto, CA (US)

( * ) Notice: Subject to any disclaimer, the term of this patent is extended or adjusted under 35 U.S.C. 154(b) by 665 days.

This patent is subject to a terminal disclaimer.

(21) Appl. No.: 13/216,088

(22) Filed: Aug. 23, 2011

(65) Prior Publication Data

US 2013/0049971 A1 Feb. 28, 2013

(51) Int. Cl.
| | |
|---|---|
| *G08B 21/00* | (2006.01) |
| *G01R 31/36* | (2006.01) |
| *H01M 10/48* | (2006.01) |
| *B60L 3/00* | (2006.01) |
| *B60L 3/04* | (2006.01) |

(Continued)

(52) U.S. Cl.
CPC ........ *G01R 31/3606* (2013.01); *G01R 31/1263* (2013.01); *H01M 10/482* (2013.01); *H01M 10/486* (2013.01); *B60L 3/0046* (2013.01); *B60L 3/0069* (2013.01); *B60L 3/04* (2013.01); *B60L 11/1861* (2013.01); *B60L 11/1864* (2013.01); *B60L 11/1872* (2013.01); *B60L 11/1874* (2013.01); *B60L 11/1879* (2013.01); *B60L 2240/545* (2013.01); *B60L 2240/547* (2013.01); *B60L 2240/549* (2013.01); *B60L 2250/10* (2013.01); *Y02T 10/7044* (2013.01);

(Continued)

(58) Field of Classification Search
CPC ............ B60L 11/1861; B60L 11/1864; B60L 11/1872; B60L 11/1874; B60L 11/1879; B60L 2240/545; B60L 2240/547; B60L 2240/549; B60L 2250/10; B60L 3/0046; B60L 3/0069; B60L 3/04; G01R 31/1263; G01R 31/3606; H01M 10/482; H01M 10/486; Y02E 60/12; Y02T 10/7005; Y02T 10/7011; Y02T 10/7044; Y02T 10/7061
USPC .......... 340/636.1; 324/433, 500, 525; 169/61; 165/287; 374/45; 429/50, 90–93
See application file for complete search history.

(56) References Cited

U.S. PATENT DOCUMENTS

| | | | |
|---|---|---|---|
| 6,952,103 B2 | 10/2005 | Herb et al. | |
| 7,248,979 B2 * | 7/2007 | Bandholz | ........................ 702/65 |

(Continued)

FOREIGN PATENT DOCUMENTS

EP          833423 A2     4/1998

*Primary Examiner* — Firmin Backer
*Assistant Examiner* — Nay Tun
(74) *Attorney, Agent, or Firm* — J. Richard Soderberg

(57) ABSTRACT

A system for detecting cell failure within a battery pack based on variations in the measured electrical isolation resistance of the battery pack is provided. The system includes an electrical isolation resistance monitoring subsystem for monitoring the electrical isolation resistance of the battery pack; a system controller coupled to the isolation resistance monitoring subsystem that detects when the electrical isolation resistance falls below a preset value; and a cell failure response subsystem that performs a preset response upon receipt of a control signal from the system controller, where the control signal is transmitted when the electrical isolation resistance falls below the preset value. The system may include a secondary effect monitoring system, wherein the cell failure response subsystem performs the preset response when the electrical isolation resistance falls below the preset value and the secondary effect is detected by the secondary effect monitoring system.

21 Claims, 14 Drawing Sheets

(51) Int. Cl.
B60L 11/18 (2006.01)
*G01R 31/12* (2006.01)

(52) U.S. Cl.
CPC .......... *Y02T10/7005* (2013.01); *Y02T 10/7061* (2013.01); *Y02T 10/7011* (2013.01)

(56) References Cited

U.S. PATENT DOCUMENTS

| | | | |
|---|---|---|---|
| 7,433,794 B1 * | 10/2008 | Berdichevsky et al. ...... 702/130 | |
| 7,564,248 B2 | 7/2009 | Breese et al. | |
| 7,576,547 B2 | 8/2009 | Muller | |
| 8,059,007 B2 | 11/2011 | Hermann et al. | |
| 8,092,081 B2 | 1/2012 | Hermann et al. | |
| 8,154,256 B2 | 4/2012 | Kreiner et al. | |
| 8,427,167 B2 | 4/2013 | Streit | |
| 2004/0247962 A1 * | 12/2004 | Toukura .......................... 429/22 |
| 2006/0003198 A1 | 1/2006 | Leitz | |
| 2007/0013382 A1 | 1/2007 | Hinz et al. | |
| 2009/0038867 A1 * | 2/2009 | Jufuku et al. .............. 180/65.31 |
| 2009/0139781 A1 * | 6/2009 | Straubel ...................... 180/65.1 |
| 2009/0261785 A1 * | 10/2009 | Cabot et al. .................. 320/134 |
| 2010/0136384 A1 | 6/2010 | Kreiner et al. | |

* cited by examiner

BATTERY THERMAL EVENT DETECTION SYSTEM UTILIZING BATTERY PACK ISOLATION MONITORING

FIELD OF THE INVENTION

The present invention relates generally to batteries and battery packs and, more particularly, to a system and method for detecting thermal events in a battery or battery pack.

BACKGROUND OF THE INVENTION

Batteries come in a wide variety of types, chemistries and configurations, each of which has its own merits and weaknesses. Among rechargeable batteries, also referred to as secondary batteries, one of the primary disadvantages is their relative instability, often resulting in these cells requiring special handling during fabrication, storage and use. Additionally, some cell chemistries, for example lithium-ion secondary cells, tend to be more prone to thermal runaway than other primary and secondary cell chemistries.

Thermal runaway occurs when the internal reaction rate of a battery increases to the point that more heat is being generated than can be withdrawn, leading to a further increase in both reaction rate and heat generation. Eventually the amount of generated heat is great enough to lead to the combustion of the battery as well as materials in proximity to the battery. Thermal runaway may be initiated by a short circuit within the cell, improper cell use, physical abuse, manufacturing defects, or exposure of the cell to extreme external temperatures.

During the initial stages of a thermal runaway event, the cell undergoing runaway becomes increasingly hot due to the increased reaction rate and the inability of the system to withdraw the heat at a rapid enough rate. As the temperature within the cell increases, so does the pressure, leading to the eventual release of at least some of the gas generated by the reaction via the safety pressure release vent that is common to most cells. After a short period of time, the increased temperature in concert with the increased internal cell pressure leads to the formation of perforations in the cell casing. Once the cell casing is perforated, the elevated internal cell pressure will cause additional hot gas to be directed to this location, further compromising the cell at this and adjoining locations.

While the increase in cell temperature during a thermal runaway event is sufficient to damage materials in proximity to the event and to lead to the propagation of the event to adjoining cells, it is not until the hot gas escapes the confines of the cell, and potentially the confines of the battery pack, that the risk to people and property damage is significant. This is because while the event is confined, the gas generated by the event is primarily composed of carbon dioxide and hydrocarbon vapors. As a result, the autoignition temperature (AIT) of combustible materials in proximity to the event is relatively high. However, once this gas exits the confines of the cell/battery pack and comes into contact with the oxygen contained in the ambient atmosphere, the AIT of these same materials will decrease significantly, potentially leading to their spontaneous combustion. It is at this point in the event cycle that extensive collateral property damage is likely to occur and, more importantly, that the risks to the vehicle's passengers leaving the vehicle, or to first responders attempting to control the event, becomes quite significant.

Accordingly, it is desirable to detect thermal runaway events, and more preferably a precursor to a thermal runaway event, as quickly as possible, thereby providing time to eliminate, or at least minimize, damage to adjacent cells and materials. The present invention provides a method and system for early detection of such events.

SUMMARY OF THE INVENTION

The present invention provides a system for detecting cell failure within a battery pack based on variations in the measured electrical isolation resistance of the battery pack. The system of the invention includes an electrical isolation resistance monitoring subsystem for monitoring the electrical isolation resistance of the battery pack, for example at a frequency of at least once per second; a system controller coupled to the isolation resistance monitoring subsystem that detects when the electrical isolation resistance falls below a preset value; and a cell failure response subsystem that performs a preset response upon receipt of a control signal from the system controller, where the control signal is transmitted when the electrical isolation resistance falls below the preset value, or when the electrical isolation resistance falls below the preset value and the fall-off rate as the electrical isolation resistance falls below the preset value is greater than a preset fall-off rate, or when the electrical isolation resistance falls below the preset value and the time period between when the electrical isolation resistance falls below the preset value and when the electrical isolation resistance recovers to a value greater than a second preset value is less than a preset time period. The system may be further comprised of a secondary effect monitoring system, wherein the cell failure response subsystem performs said preset response when the electrical isolation resistance falls below the preset value and the secondary effect is detected by the secondary effect monitoring system. The secondary effect may correspond to (i) a loss of voltage chain continuity; (ii) a battery pack temperature that exceeds a preset temperature; (iii) a battery pack humidity that exceeds a preset humidity; and/or (iv) a coolant temperature associated with a battery pack cooling system that exceeds a preset temperature. The plurality of cells comprising the battery pack may be segregated into at least a first plurality of cells and a second plurality of cells, wherein the battery pack enclosure includes at least one electrically conductive segment in electrical communication with the enclosure that is interposed between the first and second pluralities of cells. The battery pack enclosure may include a plurality of electrically conductive segments in electrical communication with the enclosure that segregate the plurality of cells comprising the battery pack into a plurality of cell groups, where each cell group includes multiple cells. The cell failure response subsystem may be comprised of a warning indicator (e.g., a visual indicator or an audible indicator) that is activated when the preset response is performed. The cell failure response subsystem may be comprised of a battery load controller that reduces or minimizes the electrical load on the battery pack when the preset response is performed. The cell failure response subsystem may be comprised of a battery pack cooling system that is activated, or where the cooling applied to the battery pack is increased, when the preset response is performed. The cell failure response subsystem may be comprised of a fire containment subsystem that is activated when the preset response is performed. The system may further comprise a memory coupled to the system controller, wherein date and time information corresponding to the electrical isolation resistance falling below the preset value is recorded in memory when the preset response is performed. The system may further comprise a communication and notification subsystem coupled to the system controller, wherein a notification message is transmitted via the communication and notification subsystem when the preset response is performed.

A further understanding of the nature and advantages of the present invention may be realized by reference to the remaining portions of the specification and the drawings.

DESCRIPTION OF THE SPECIFIC EMBODIMENTS

In the following text, the terms "battery", "cell", and "battery cell" may be used interchangeably and may refer to any of a variety of different cell types, chemistries and configurations including, but not limited to, lithium ion (e.g., lithium iron phosphate, lithium cobalt oxide, other lithium metal oxides, etc.), lithium ion polymer, nickel metal hydride, nickel cadmium, nickel hydrogen, nickel zinc, silver zinc, or other battery type/configuration. The term "battery pack" as used herein refers to multiple individual batteries contained within a single piece or multi-piece housing, the individual batteries electrically interconnected to achieve the desired voltage and capacity for a particular application. The term "electric vehicle" as used herein refers to either an all-electric vehicle, also referred to as an EV, a plug-in hybrid vehicle, also referred to as a PHEV, or a hybrid vehicle (HEV), where hybrid vehicles utilize multiple propulsion sources one of which is an electric drive system. It should be understood that identical element symbols used on multiple figures refer to the same component, or components of equal functionality. Additionally, the accompanying figures are only meant to illustrate, not limit, the scope of the invention and should not be considered to be to scale.

Electric vehicles, both those utilizing all-electric drive trains (i.e., EVs) and those utilizing multiple propulsion sources one of which is an electric drive system (i.e., hybrids), utilize high voltage batteries/battery packs as well as a variety of high voltage electronic and power system components. As a result of these high voltage and high power levels, it is imperative that the high voltage power system be electrically isolated, both in order to protect other vehicle components that are susceptible to high voltage damage as well as to insure the safety of vehicle passengers and others that may possibly come into contact with an electric vehicle's high voltage system (e.g., service technicians, crash site first responders, bystanders, etc.).

A variety of standards have been generated that are intended to insure that the high voltage system of an electric vehicle is sufficiently isolated from other vehicle structures. One such standard, SAE J1766, provides that the value for the electrical isolation of a high voltage battery pack that is not continuously monitored must be 500 Ohms/volt or greater. It will be appreciated that given the potential risks associated with a loss of battery isolation, some electric vehicles continually monitor the isolation resistance of the battery pack.

Several methods of determining the electrical isolation resistance of a battery pack are provided herein, although it should be understood that the present invention is not limited to a particular technique and the described methods are simply provided for clarity.

Figure 1:
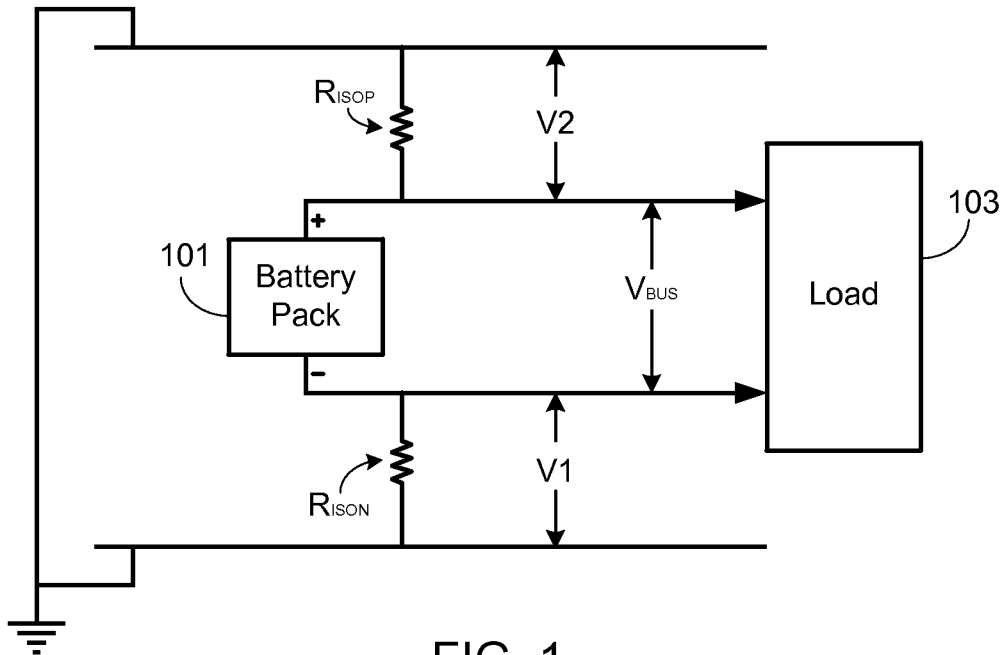
FIG. 1 provides a simplified representation of a high voltage system applicable to electric vehicles.
Figure 2:
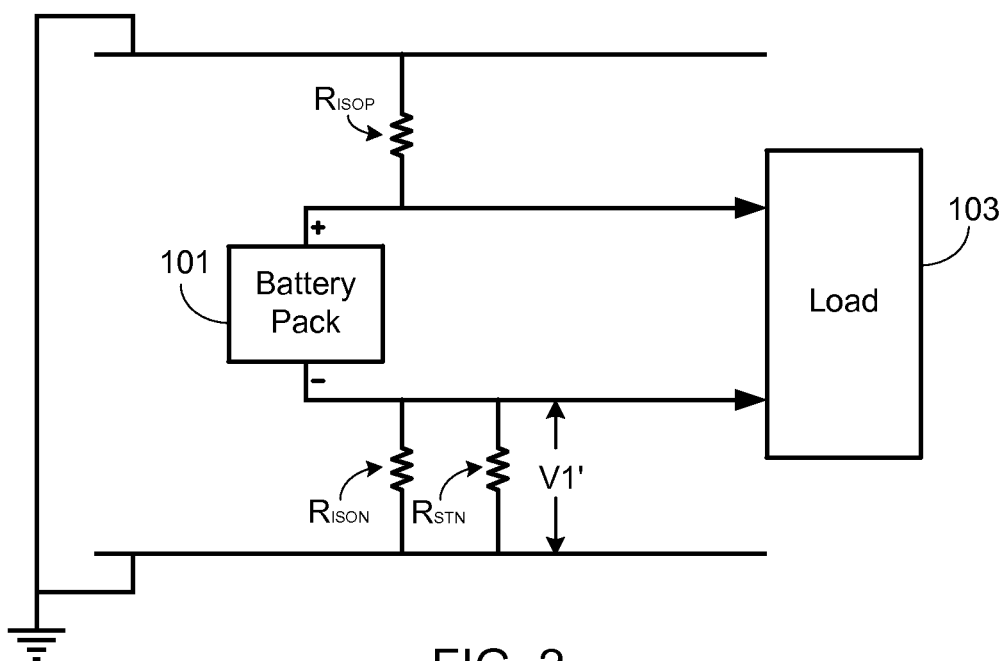
FIG. 2 illustrates the high voltage system shown in FIG. 1, with the addition of a known resistance inserted between the negative high voltage bus and ground.
Figure 3:
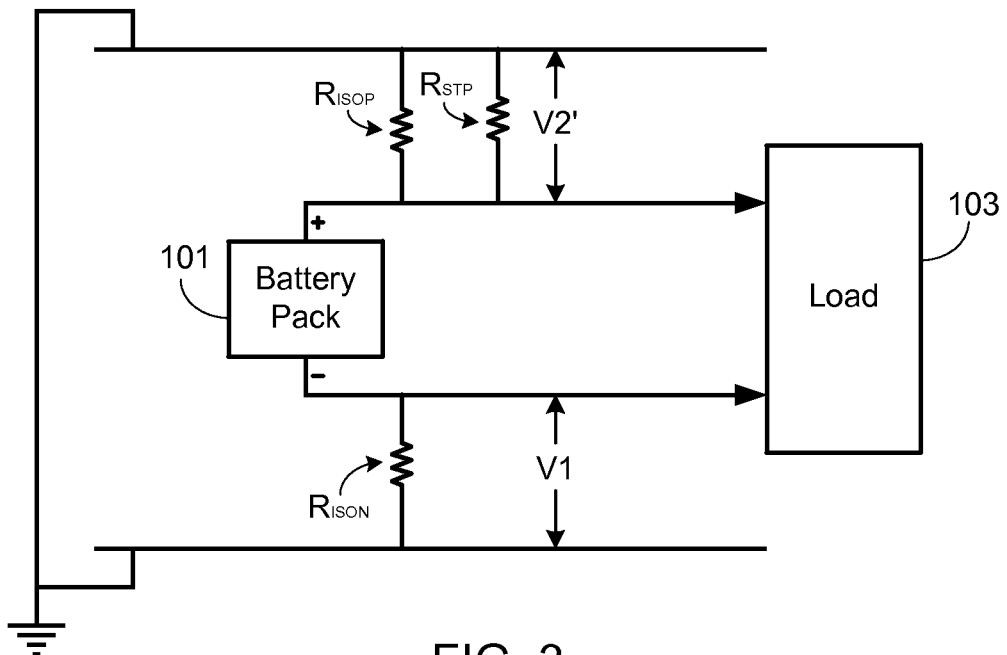
FIG. 3 illustrates the high voltage system shown in FIG. 1, with the addition of a known resistance inserted between the positive high voltage bus and ground.

FIGS. 1-3 illustrate one technique of determining electrical isolation resistance, this technique best suited for systems in which the bus voltage remains unchanged between measurements. In FIG. 1, a simplified representation of a high voltage system applicable to electric vehicles is provided. As shown, battery pack 101 is coupled to a load 103, load 103 representing the high voltage motor and/or other high voltage components associated with an electric vehicle. In the conventional isolation measurement technique, the voltage V1 between the negative side of the high voltage bus and ground is measured as is the voltage V2 between the positive side of the high voltage bus and ground. If V1 is greater than V2, then it is given that the isolation resistance $R_{ISON}$ on the negative side of the bus is greater than the isolation resistance $R_{ISOP}$ on the positive side of the bus. Since the lower isolation resistance is of greater importance from a safety point of view, in the next step of the method a standard known resistance $R_{STN}$ is inserted between the negative side of the high voltage bus and ground. Then V1' is measured (see FIG. 2) and $R_{ISOP}$ calculated from the equation:

$$R_{ISOP}=R_{STN}(1+V2/V1)((V1-V1')/V1')$$

Similarly, if V2 is greater than V1, then $R_{ISON}$ is determined by inserting a standard known resistance $R_{STP}$ between the positive side of the high voltage bus and ground. Next, V2' is measured (see FIG. 3) and $R_{ISON}$ calculated from the equation:

$$R_{ISON}=R_{STP}(1+V1/V2)((V2-V2')/V2')$$

In a conventional system, in order to determine whether or not the isolation resistance is large enough to meet the applicable standard the calculated isolation resistance, either $R_{ISOP}$ if V1>V2 or $R_{ISON}$ if V2>V1, is divided by the high voltage bus voltage, $V_{BUS}$, and compared to the minimum acceptable isolation resistance per volt as provided by the applicable standard.

Figure 4:
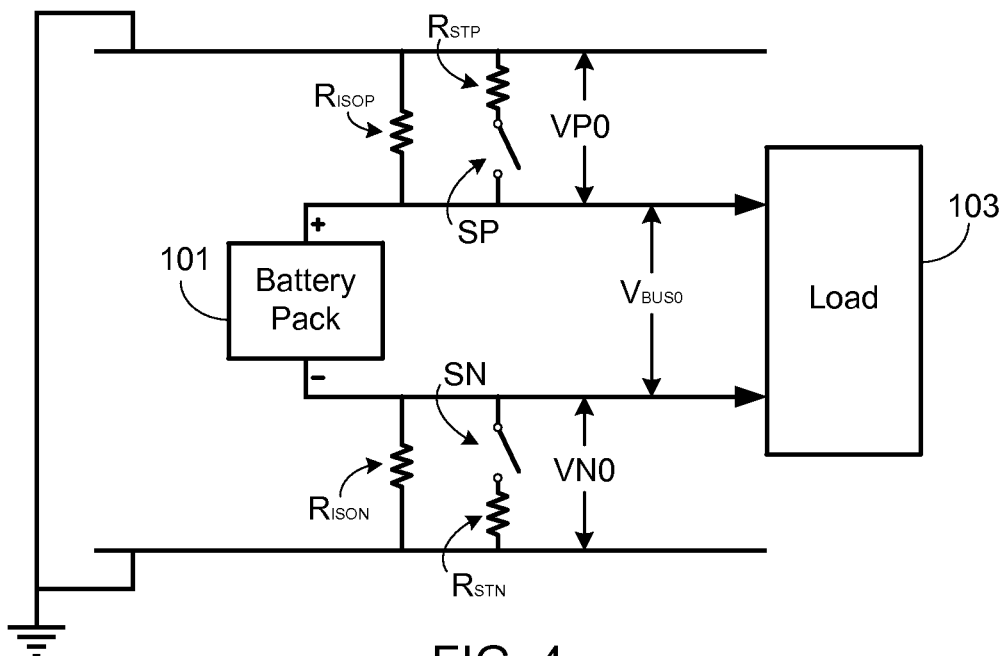
FIG. 4 illustrates an alternate isolation resistance measurement system that is also applicable to the present invention.
Figure 5:
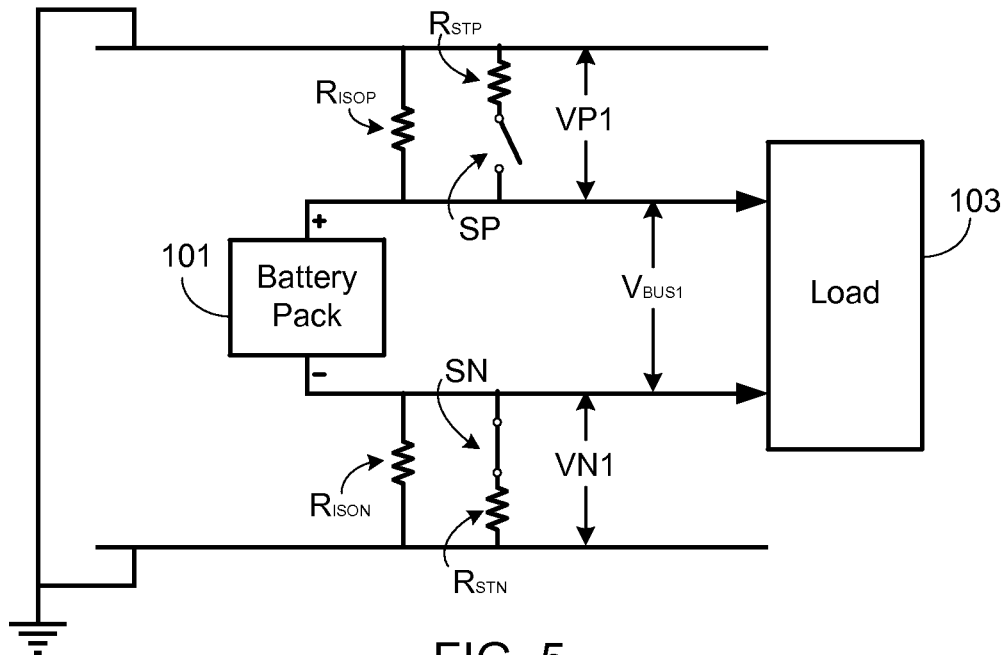
FIG. 5 illustrates the isolation measurement system of FIG. 4 with the switch on the negative bus closed.
Figure 6:
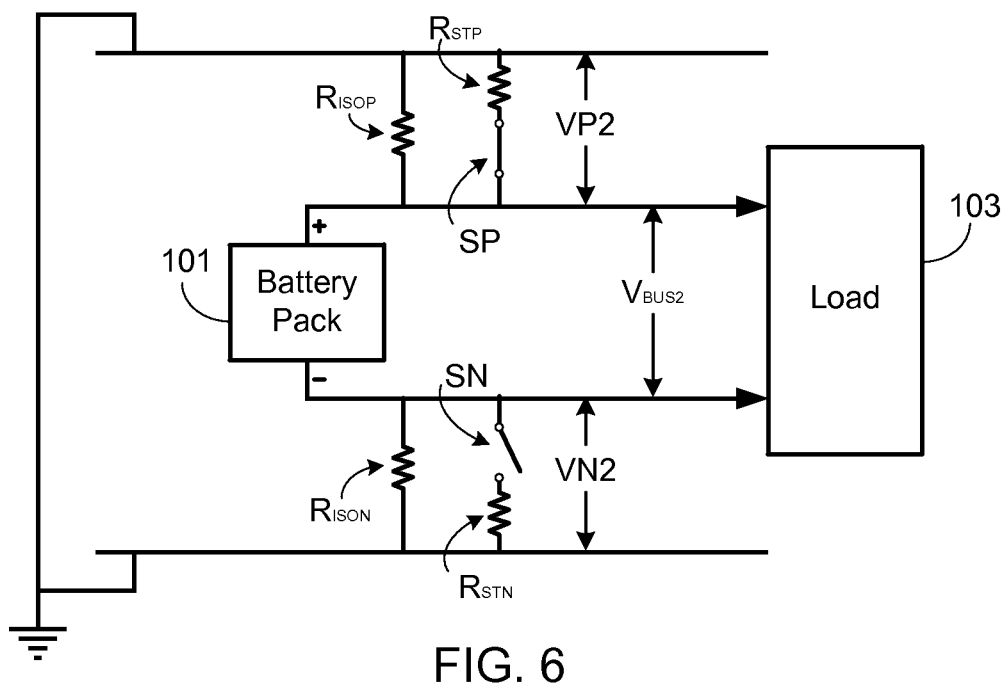
FIG. 6 illustrates the isolation measurement system of FIG. 4 with the switch on the positive bus closed.

FIGS. 4-6 illustrates an alternate technique of determining electrical isolation resistance, this technique best suited for systems in which the isolation resistance is continually re-measured as preferred with the present invention. It will be appreciated that the prior technique (i.e., as shown in FIGS. 1-3) may also be used in a system in which isolation resistance is continually re-measured, although the prior technique is not as simple as the technique described below.

In the system illustrated in FIGS. 4-6, means are included for switching a standard known resistance between ground and either the high voltage positive bus or the high voltage negative bus. As shown, a switch SP is used to insert a known resistance $R_{STP}$ between the positive bus and ground. Similarly, a switch SN is used to insert a known resistance $R_{STN}$ between the negative bus and ground.

The first step of this technique is to measure the voltage VP0 between the positive bus and ground, and to measure the voltage VN0 between the negative bus and ground. Preferably VP0 and VN0 are measured at the same time. These voltages are measured with SP and SN open as shown in FIG. 4. These two voltages can be represented as:

$$VP0 = V_{BUS0} * [R_{ISOP}/(R_{ISOP}+R_{ISON})]; \quad [1]$$

$$VN0 = V_{BUS0} * [R_{ISON}/(R_{ISOP}+R_{ISON})]; \quad [2]$$

Dividing equation [1] by equation [2] yields:

$$VP0/VN0 = R_{ISOP}/R_{ISON}; \quad [3]$$

Solving equation [3] for $R_{ISOP}$ yields:

$$R_{ISOP} = R_{ISON} * (VP0/VN0); \quad [4]$$

Similarly, solving equation [3] for $R_{ISON}$ yields:

$$R_{ISON} = R_{ISOP} * (VN0/VP0); \quad [5]$$

Next, the voltages measured for the positive and negative buses are compared in order to determine which bus has the lower isolation resistance since it is the lower isolation resistance that is of greater importance from a safety point of view. For clarity, a description of the methodology based on a lower isolation resistance on the positive bus as well as a description of the methodology based on a lower isolation resistance on the negative bus will be described.

From equation [3], if it is determined that VP0 is less than VN0, then it is given that $R_{ISOP}$ is less than $R_{ISON}$. As such, in this case $R_{ISOP}$ is the isolation resistance of interest. To determine $R_{ISOP}$, switch SN is closed as illustrated in FIG. 5, thereby introducing a known resistance $R_{STN}$ between the negative high voltage bus and ground. Next, the voltage VP1 between the positive bus and ground, and the voltage VN1 between the negative bus and ground are each measured. Preferably VP1 and VN1 are measured simultaneously. The values for VP1 and VN1 can be described by:

$$VP1 = V_{BUS1} * \left[\frac{R_{ISOP}}{R_{ISOP}+\left(\frac{R_{ISON}*R_{STN}}{R_{ISON}+R_{STN}}\right)}\right]; \text{ and} \quad [6]$$

$$VN1 = V_{BUS1} * \left[\frac{\left(\frac{R_{ISON}*R_{STN}}{R_{ISON}+R_{STN}}\right)}{R_{ISOP}+\left(\frac{R_{ISON}*R_{STN}}{R_{ISON}+R_{STN}}\right)}\right]; \quad [7]$$

Dividing equation [6] by equation [7] yields:

$$VP1/VN1 = \frac{R_{ISOP}}{\left(\frac{R_{ISON}*R_{STN}}{R_{ISON}+R_{STN}}\right)}; \quad [8]$$

Substituting equation [5] into equation [8] yields:

$$R_{ISOP} = R_{STN} * (VP1/VN1 - VP0/VN0); \quad [9]$$

Similarly, if it is determined that VN0 is less than VP0, then $R_{ISON}$ is less than $R_{ISOP}$ and the isolation resistance of the negative bus, $R_{ISON}$, is the isolation resistance of interest. To determine $R_{ISON}$, switch SP is closed rather than switch SN as illustrated in FIG. 6, thereby introducing a known resistance $R_{STP}$ between the positive high voltage bus and ground. Next, the voltage VP2 between the positive bus and ground, and the voltage VN2 between the negative bus and ground are each measured. Preferably VP2 and VN2 are measured simultaneously. The values for VP2 and VN2 can be described by:

$$VP2 = V_{BUS2} * \left[\frac{\left(\frac{R_{ISOP}*R_{STP}}{R_{ISOP}+R_{STP}}\right)}{R_{ISON}+\left(\frac{R_{ISOP}*R_{STP}}{R_{ISOP}+R_{STP}}\right)}\right]; \text{ and} \quad [10]$$

$$VN2 = V_{BUS2} * \left[\frac{R_{ISON}}{R_{ISON}+\left(\frac{R_{ISOP}*R_{STP}}{R_{ISOP}+R_{STP}}\right)}\right]; \quad [11]$$

Dividing equation [10] by equation [11] yields:

$$VP2/VN2 = \frac{\left(\frac{R_{ISOP}*R_{STP}}{R_{ISOP}+R_{STP}}\right)}{R_{ISON}}; \quad [12]$$

Substituting equation [4] into equation [12] yields:

$$R_{ISON} = R_{STP} * (VN2/VP2 - VN0/VP0); \quad [13]$$

It will be appreciated that if it is determined that VN0 is equal to VP0, then the isolation resistance for the positive high voltage will be equivalent to the negative high voltage and the isolation resistance may be calculated using either equation [9] or equation [13].

Figure 7:
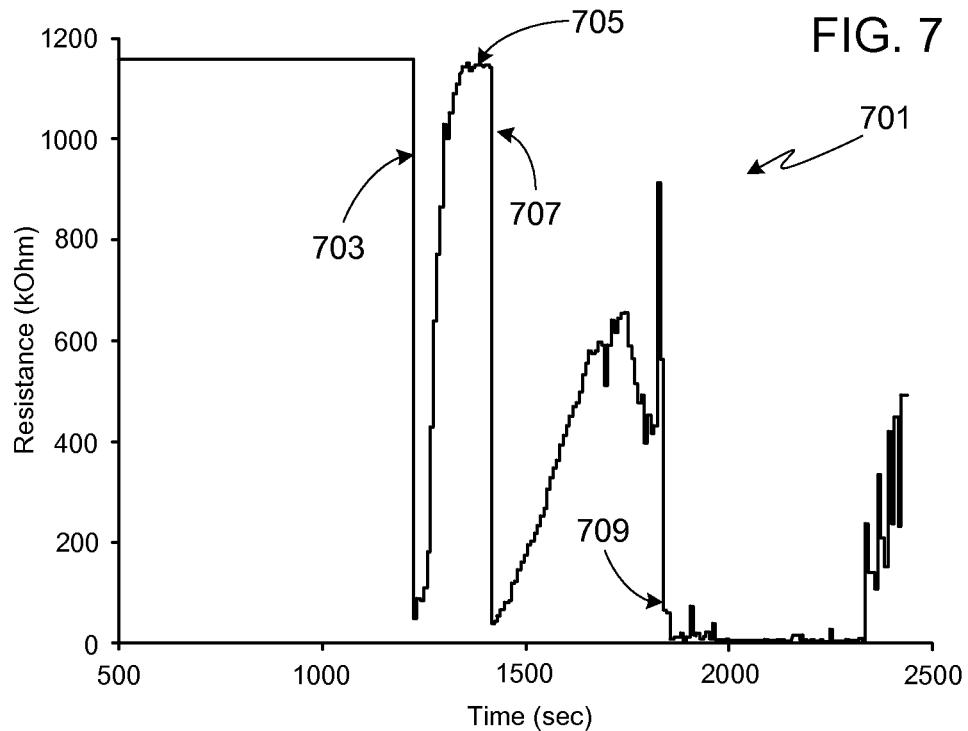
FIG. 7 graphically illustrates the changes in isolation resistance that occur when one cell within a battery pack overheats.

Regardless of the technique used to detect and monitor the isolation resistance of the battery pack, the inventor has found that the isolation resistance may be used as an indicator of a failing cell within a battery pack, and more specifically of a cell within the battery pack overheating. FIG. 7 illustrates this phenomenon.

In the example illustrated in FIG. 7, the cell under test includes a pressure release vent that is designed to rupture at high pressures, thereby providing a pathway for the release of gas and cell contents during an overheating event, for example one due to an internal short circuit. While the inclusion of a safety vent is common, not every cell configuration includes such a vent. Although the release of pressure via a safety vent provides an early indicator of cell overheating, it should be understood that the inclusion of a safety vent is not required for the present invention to detect cell failure.

In FIG. 7, an isolation resistance measurement (curve 701) is taken over time during which one cell within a battery pack undergoes failure. As shown, prior to cell failure the isolation resistance is relatively constant at a value of approximately 1150 kOhms. Once the cell fails, for example due to an internal short, and begins to overheat, the internal pressure of the cell increases until the safety vent, also referred to herein as a pressure relief vent, opens. This stage of gas release may be due to the rising electrolyte vapor pressure within the cell. When the safety vent opens, electrolyte vapor is released into the battery pack. These gases, either alone or upon mixing and reacting with the environment inside the battery pack, are often electrically conductive. The electrically conductive gas causes a temporary loss of electrical isolation between the battery voltage chain and the battery pack enclosure (or between the battery voltage chain and conductive materials in electrical communication with the battery pack enclosure). In FIG. 7, region 703 illustrates the sudden loss of electrical isolation that results from the opening of the cell vent.

The inventor has found that while the loss of electrical isolation during the first venting is quite rapid and easily detectable, the isolation resistance quickly recovers, and within a matter of a minute or two re-attains the initially measured isolation resistance, or close to the initially measured isolation resistance (region 705). The rapid recovery of the isolation resistance is likely due to the relatively small amount of vapor released during the first venting, and the swift dilution of this vapor within the environment of the enclosure.

While the isolation resistance rapidly increases to, or close to, the initial resistance after the first venting, this resistance level is only maintained for a short period of time before another sharp decrease in isolation resistance is detected (region 707). This decrease in isolation resistance is due to a second stage of venting. During the second stage of venting chemical reactions within the cell generate gases such as carbon dioxide and hydrogen which are vented, along with additional electrolyte vapor, into the battery pack enclosure. Combustion reactions generating water may further promote the formation of acids and mobile ions which may contribute to the loss of electrical isolation during the second venting stage. Due to the exothermic nature of the reactions within the cell, the second venting stage is often accompanied by the formation of one or more perforations within the cell casing, thereby expediting the release of materials into the battery pack. While both the first and second stages of venting are characterized by a steep falling edge in the monitored isolation resistance, only the first venting stage is accompanied by a relatively rapid, and substantially complete, recovery of the initial isolation resistance value. In contrast to the first stage, the isolation resistance following the second venting event undergoes only a very gradual increase in resistance, never fully recovering. The shape of the partial recovery curve following the second venting event may be due to the volume as well as the character of the materials released during this venting stage. This curve shape may also be at least partially attributable to an increase in the size of existing perforations as well as the formation of new cell casing perforations. Note that once the cell enters into thermal runaway (location 709), the isolation resistance falls again, showing no signs of recovery.

It will be appreciated that while cell venting may be monitored using chemical sensors, the use of such sensors adds to the weight, cost and complexity of the battery pack. In contrast, the present invention relies on the isolation resistance detection system that is already in place within the electric vehicle, and as a result does not add to the weight, cost and/or complexity of the battery pack. Additionally, chemical sensors as well as other types of sensors that may be used to monitor cell venting provide only localized detection, i.e., localized to the location of the sensor(s). By relying on isolation resistance monitoring, the present invention is not limited to localized regions within the battery pack.

Figure 8:
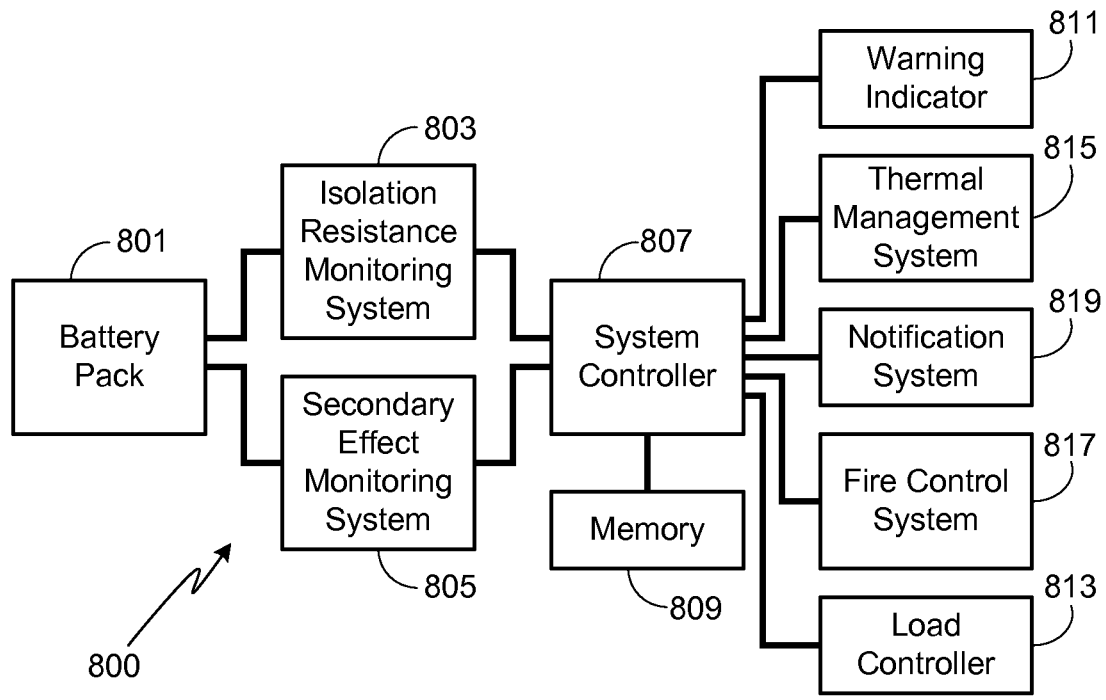
FIG. 8 illustrates the basic elements of a system that is designed to detect cell thermal events within the battery pack by monitoring battery pack isolation resistance.

FIG. 8 illustrates the basic elements of a system 800 that is designed to detect cell thermal events within the battery pack by monitoring battery pack isolation resistance. After event detection, system 800 is configured to perform one or more functions in response to the detected thermal event. As shown, battery pack 801 is coupled to a system 803 that monitors battery pack isolation resistance. Preferably system 803 is configured to determine the isolation resistance with sufficient frequency to allow the system to take appropriate action upon the detection of the onset of cell failure, for example on the order of at least once every 5 seconds, more preferably at least once every second, and still more preferably at a frequency of less than once per second. Battery pack 801 includes at least one, and typically hundreds or thousands of rechargeable cells. It will be appreciated that the invention is not limited to a particular type of battery or battery pack configuration and instead is useful for any type of rechargeable battery including, but not limited to, metal-air cells, lithium ion cells (e.g., lithium iron phosphate, lithium cobalt oxide, other lithium metal oxides, etc.), lithium ion polymer cells, nickel metal hydride cells, nickel cadmium cells, nickel hydrogen cells, nickel zinc cells, silver zinc cells, etc.

In addition to system 803 that determines isolation resistance, preferably at least one secondary effect monitoring system 805 is also coupled to battery pack 801. Although not required by the invention, inclusion of system 805 within system 800 provides a second means for detecting a possible cell failure, thus providing a method for potentially confirming the existence of a failing cell within the battery pack. By including system 805, or multiple systems 805, system 800 is less likely to respond to a false event. It will be appreciated that there are numerous techniques that may be used to monitor for possible cell failures. Exemplary techniques include (i) a loss of voltage chain continuity, (ii) a spike in battery pack temperature, for example detected using one or more temperature sensors incorporated into the battery pack, (iii) a sudden increase in the relative humidity within the battery pack enclosure (i.e., the result of water vapor being generated as a cell combustion by-product), for example detected using one or more humidity sensors incorporated into the battery pack; (iv) a spike in the monitored temperature of the coolant used to cool the battery cells/pack, (v) an increase in battery pack temperature as determined by monitoring the transmission of light through an optical fiber incorporated into the battery pack (see, for example, co-pending U.S. patent application Ser. No. 12/455,173, incorporated herein), (vi) an increase in battery pack temperature as determined by monitoring the electrical continuity of a thermally interruptible electrical conductor incorporated into the battery pack (see, for example, co-pending U.S. patent application Ser. No. 12/455,198, incorporated herein), (vii) an increase in battery pack temperature as determined by monitoring the voltage of an insulated conductor incorporated into the battery pack (see, for example, co-pending U.S. patent application Ser. No. 12/455,248, incorporated herein), and/or other means. It will be appreciated that in order to minimize system complexity, weight and cost, preferably secondary effect monitoring system 805 utilizes sensors and systems that are already in place (e.g., battery cell/pack temperature sensors). To increase event detection reliability, preferably the occurrence of an event detected using the isolation resistance monitoring system 803 and an event detected using the secondary monitoring system 805 must occur within a preset time period of one another before system controller 807 registers a cell failure. The preset time period may be on the order of 5 seconds, 30 seconds, 1 minute, 3 minutes, 5 minutes, 10 minutes, etc. However, as the goal of the present invention is to detect an early stage of cell failure, and preferably before the cell undergoes thermal runaway, preferably the preset time period is set to a relatively short time period (e.g., 3 minutes or less, and more preferably 1 minute or less).

System controller 807 is used to monitor the output from system 803, or systems 803/805, and follow a preset course of action upon detection of a cell failure. Controller 807 may be a stand-alone controller or integrated into another vehicle control system, for example a vehicle management system. In addition to a control processor, controller 807 may also include a memory 809 for storing a preset set of control instructions. Memory 809 may be comprised of flash memory, a solid state disk drive, a hard disk drive, or any other memory type or combination of memory types.

Once cell failure has been detected by the system of the invention, system controller 807 can be programmed to perform any of a variety of responses. It will be appreciated that the system can be programmed to perform either single or multiple responses, and in the latter case the responses can be performed serially or in parallel. Exemplary responses include:

- A warning indicator 811 may be coupled to system controller 807 that provides a visual or audible indicator, or both, of a detected battery thermal event. For example, in an electric vehicle, indicator 811 may be an indicator light mounted in an instrument cluster on the dashboard and/or a graphic/symbol displayed on a vehicle interface and/or an audible alarm generated by a sound generator coupled to, or separate from, the vehicle's audio system.
- System controller 807 may be coupled to means 813 for modifying the load on the battery pack once a cell failure event is detected. If the thermal event detected by the system is a precursor to thermal runaway, eliminating or at least reducing the load may prevent further increases in battery temperature, thereby possibly preventing battery thermal runaway. Means 813 may also help to achieve a controlled shut-down of the electric vehicle. Typically means 813 is a control circuit used to control and couple the power from the battery pack to the electric vehicle systems (i.e., motor, auxiliary systems, etc.).
- System controller 807 may be used to activate or alter the cooling output of a battery pack thermal management system 815, thus helping to reduce the temperature of the battery or batteries exhibiting increased temperature. Note that thermal management system 815 may be comprised solely of a cooling system or a combination of a cooling and a heating system (although only the cooling portion would be required in the event of a cell failure). System 815 may be the thermal management system used to routinely control the temperature of the cells within the battery pack or, in at least one embodiment, system 815 may be an additional cooling system that is used in conjunction with the standard thermal management system. System 815 is used during cell failure to try and prevent thermal runaway from occurring if the monitored thermal event is a precursor to thermal runaway, and if thermal runaway is already occurring, prevent its propagation to neighboring cells. System 815 may be comprised of either a liquid or gas based cooling system.
- An emergency fire extinguishing and/or containment system 817 may be coupled to system controller 807. It will be appreciated that when a battery undergoes thermal runaway, the temperatures are sufficient to cause the combustion of cell materials and/or materials in proximity to the affected cells. Accordingly the purpose of fire control system 817 is to contain any such fire and prevent it from spreading to adjacent components/materials. Fire control system 817 may be either liquid or gas based.
- In a battery pack containing a large number of cells, the system may be designed to continue operation even after one or more cells have ceased operation due to a thermal runaway event. Accordingly, in at least one embodiment system controller 807 is designed to record the time and date of the cell failure, for example recording this information in memory 809. A record of cell failure events can later be used to determine potential battery failure mechanisms, for example by noting the demands being placed on the battery pack at the time of failure or the ambient temperature at the time of failure. Additionally, this information can be used to diagnose other, related issues with the electric vehicle. For example, the record of a cell failing in an electric vehicle's battery pack can be used to diagnose an exhibited loss of vehicle power, charging problems, etc.
- In at least one embodiment, system controller 807 is coupled to an on-board communication system 819 that transmits a notification message that reports thermal events to a user and/or service provider (e.g., vehicle manufacturer) via a communication network such as a cellular, internet, satellite or other network (not shown). This system allows the end user to be notified of a problem even if they are not in close proximity to the electric vehicle. Alternately, the system can be used to notify a pre-selected service company or emergency service provider (e.g., vehicle manufacturer) that a thermal event has been monitored that will require servicing.

In order to detect a reduction in isolation resistance as previously described, the vapors and materials vented during the cell failure must be close enough to the conductive elements of the voltage chain and an electrically conductive portion of the battery pack to increase the electrical conductivity between the two conductive elements. Clearly if the venting event is too far removed from these two conductive elements, the vented gases and materials may become too dilute by the time that they reach the conductive elements of the battery pack, i.e., the voltage chain and the enclosure, to affect the isolation resistance. This is especially true during the first venting stage when only a small amount of vapor/material is expelled from the failing cell. Furthermore, in some instances where the failing cell is close enough to affect the isolation resistance, but far enough away to have only a small effect on the isolation resistance, system controller 807 may determine that no event has taken place due to the minor change in isolation resistance, thereby causing the failing cell to be overlooked. Note that this is less of a problem during the second venting stage due to the amount of vapor and material expelled during this stage. However, as it is preferable to detect a failing cell as early as possible (i.e., during the first venting stage) in order to maximize the amount of time available to take corrective or compensating action, in at least one preferred embodiment of the invention the battery pack is modified to alleviate this problem.

It will be appreciated that there are numerous techniques that may be used to either extend the enclosure such that the enclosure potential is proximate to each of the cells comprising the battery pack, and preferably close to the venting regions of those cells, or to extend current collector and/or voltage sensing wires into proximity to the enclosure. Furthermore, it should be understood that the present invention is not limited to one particular technique of insuring that each cell of the battery pack is proximate to the conductive elements of the battery pack in such a way that the first stage of venting affects the isolation resistance of the battery pack.

Figure 9:
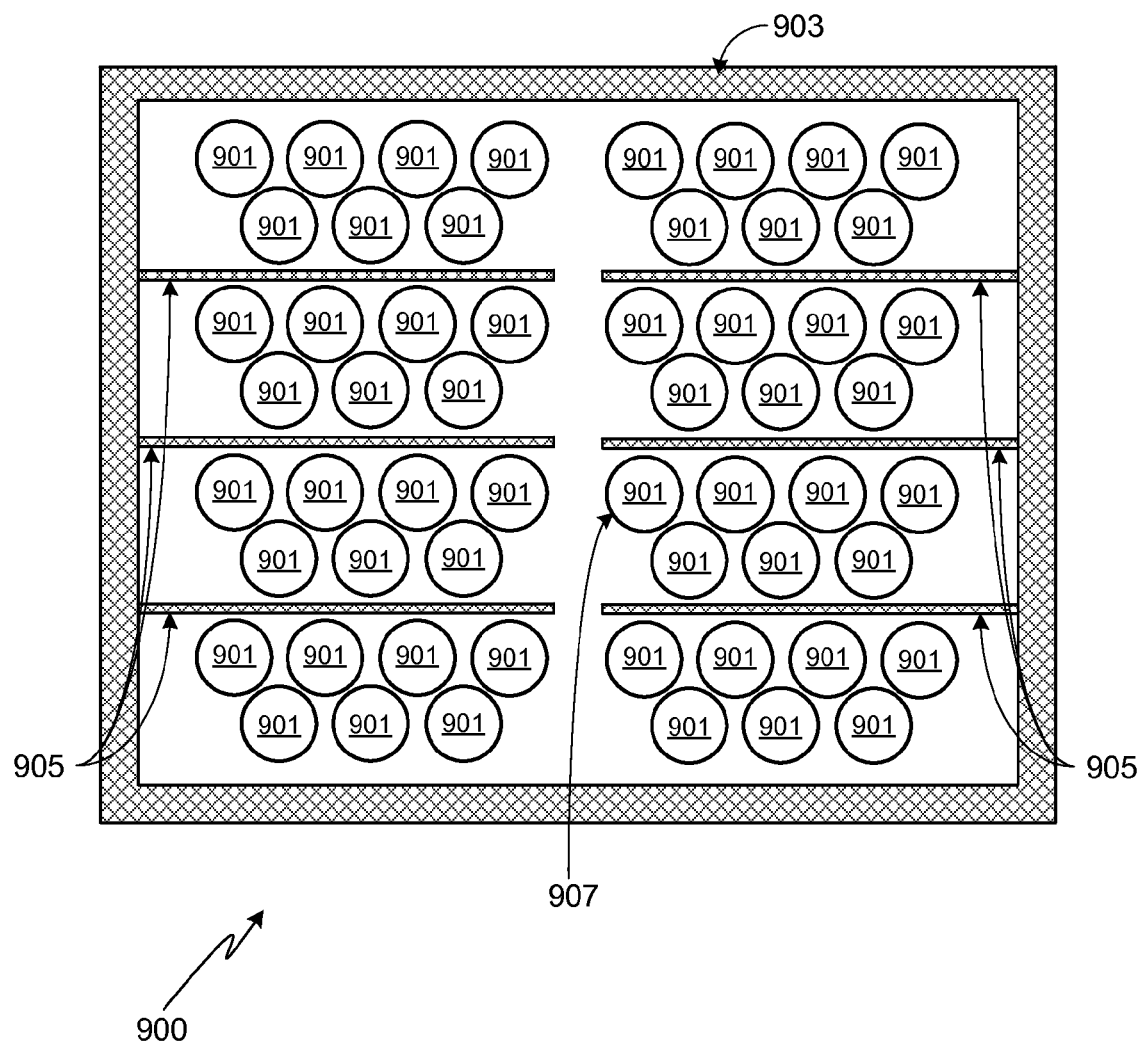
FIG. 9 provides a cross-sectional view of an exemplary battery pack that has been modified to insure proximity between the conductive elements of the battery pack, thus insuring that a cell failure is always detected regardless of the position of the cell within the pack.
Figure 10:
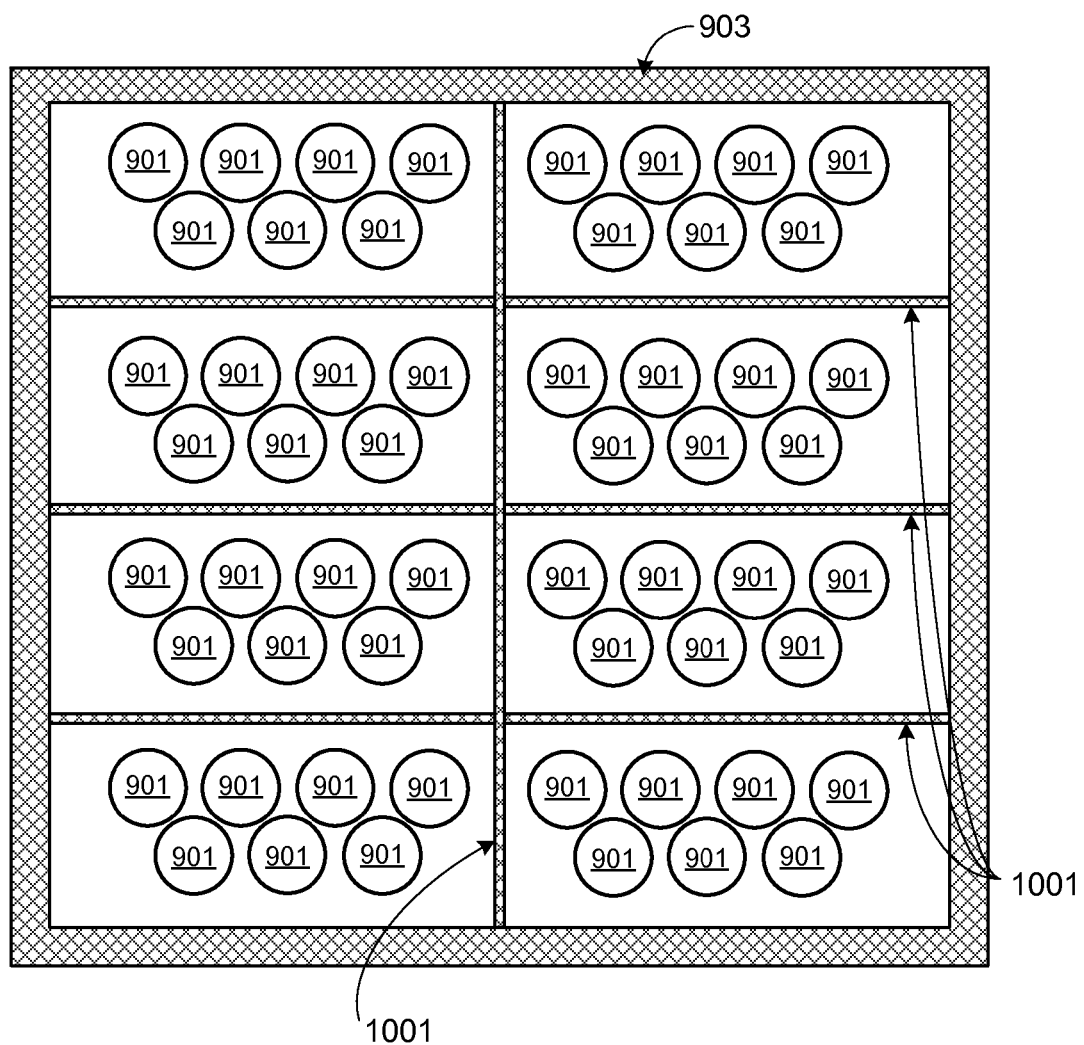
FIG. 10 provides a cross-sectional view of an alternate battery pack, based on the battery pack shown in FIG. 9, which has been further modified to avoid inadvertent isolation loss.

FIG. 9 provides a cross-sectional view of a battery pack 900 that has been modified to insure that as a cell vents, the vented vapor and material is close enough to both the enclosure and the voltage chain to affect the isolation resistance of the battery pack, even during the first stage of venting. In this illustration the battery pack is comprised of 6 sets of cells, where each set of cells includes 7 cells 901, although clearly the invention is not limited to this configuration. Cells 901 are contained within a battery pack enclosure 903. The isolation resistance is the measured resistance between the conductive portions of the battery pack, e.g., enclosure 903, and the voltage chain, e.g., cells 901. As shown, a plurality of electrically conductive segments 905 are in electrical communication with enclosure 903, thus extending the electrical potential of the enclosure to the regions between sets of cells. Electrically conductive segments 905 may be comprised of electrically conductive material, or comprised of an electrically insulating member in combination with an electrically conductive element (e.g., metal tracing, metal wire, etc.), the electrically conductive element in electrical communication with the enclosure. As a result of the electrically conductive segments, when a cell that is located near the center of the enclosure, for example cell 907, begins to fail and vent vapor and material, the measured electrical isolation resistance will be immediately affected as previously described. It should be understood, and as previously noted, the system shown in FIG. 9 is merely meant to illustrate the concept of extending one of the conductive elements of the battery pack to insure rapid detection of a cell failure and venting event. Other methods may also be used to extend one or both of the conductive elements of the battery pack. It is important, however, that regardless of the technique used to extend the conductive elements, that these electrically conductive segments do not inadvertently cause a loss of isolation resistance, for example as the electric vehicle using the battery pack is driven over very uneven driving surfaces, or as debris accumulates within the pack. Thus it is important that the electrically conductive extensions have sufficient rigidity and provide sufficient space between the cell voltage chains and the enclosure. For example, FIG. 10 illustrates a minor variation of the battery pack shown in FIG. 9 in which the enclosure extensions 1001 extend completely through the enclosure for added stability, and where further spacing has been provided between members 1001 and cells 901. In at least one other embodiment, channels are used to couple the venting structures of the cells to regions where the vented gas/material may affect the isolation resistance by bridging the gap between the conductive elements.

Figure 11:
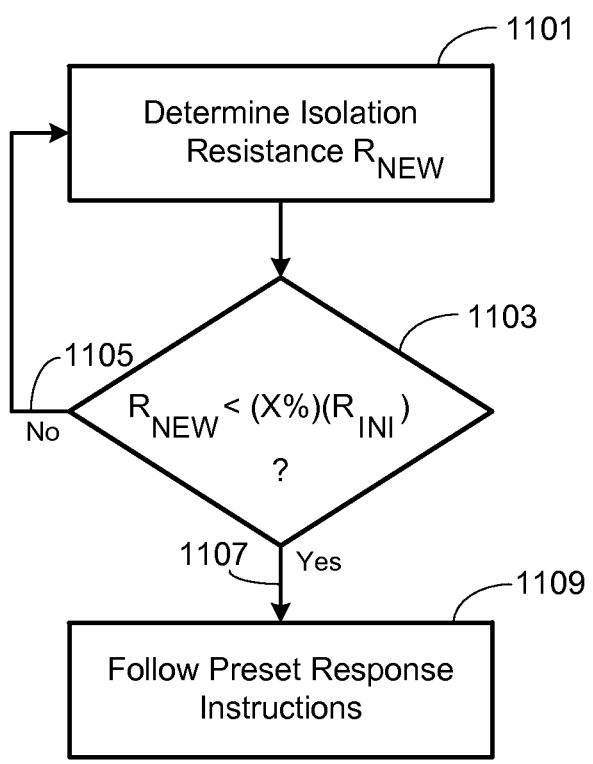
FIG. 11 illustrates a method applicable to the invention.

Although there are various methodologies that may be used to determine when a cell is failing based on a drop in isolation resistance, in general, and as illustrated in FIG. 11, the method includes several basic steps. First, system controller 807 determines the isolation resistance of battery pack 801 using isolation resistance monitoring system 803 (step 1101). As previously noted, various techniques may be used to determine the isolation resistance.

Once the isolation resistance, $R_{NEW}$, of battery pack 801 is determined, it is compared to a preset resistance value (step 1103). Although various methods may be used to set the value of the preset resistance value, typically it is based on the initial isolation resistance, $R_{INI}$, for the battery pack. The value for the initial isolation resistance of the battery pack may be determined using any of a variety of techniques, for example being preset during initial battery pack characterization or based on the average isolation resistance of the battery pack as measured over time or based on the particular battery pack configuration which may be common to a large number of vehicles. In at least one embodiment, the preset resistance value is based on a percentage of the initial isolation resistance, i.e., $[(X\%)(R_{INI})]$. While the percentage, X %, may be set at any particular value, typically it is based on the characteristics of the battery pack, the characteristics of the cells within the battery pack, and the desired sensitivity of the system to venting events. In general, the inventor has found that a percentage in the range of 10% to 75%, and more preferably in the range of 25% to 50% or 10% to 25%, works quite well. As long as the isolation resistance, $R_{NEW}$, is greater than the preset resistance value, the system simply continues to monitor the isolation resistance of the battery pack (step 1105). If $R_{NEW}$ is less than the preset resistance value (step 1107), then in at least one embodiment the system controller 807 is configured to follow a preset set of instructions (step 1109). For example, and as described in detail above, the system controller may (i) activate a warning indicator, (ii) modify the load applied to the battery pack, (iii) activate and/or modify the cooling applied to the battery pack, (iv) activate a fire control system, (v) record the occurrence as well as the characteristics associated with the occurrence, (vi) activate a notification system, or perform some combination of (i) through (vi).

Figure 12:
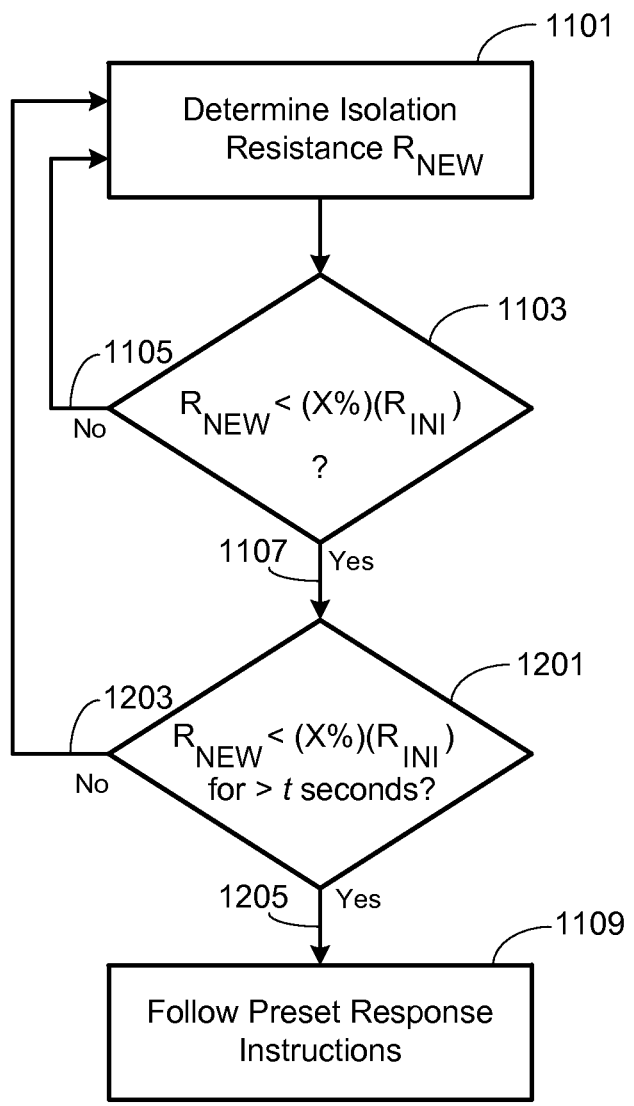
FIG. 12 illustrates an alternate method applicable to the invention.

In at least one embodiment of the invention, and as illustrated in FIG. 12, if $R_{NEW}$ is less than the preset resistance value (step 1107), then the system determines how long $R_{NEW}$ has been less than the preset resistance value (step 1201). Step 1201 is added to the method to improve the confidence associated with a determination of cell failure, thereby avoiding situations in which a momentary anomaly has caused the system to find a value for the isolation resistance that is less than the preset resistance value. Typically the value, t, used in step 1201 is set at some value between 0.1 and 1 second, or between 1 and 5 seconds, or between 5 and 10 seconds. If $R_{NEW}$ has not been less than the preset resistance value for a period of time greater than the preset period of time, then the system continues to monitor the battery pack's isolation resistance (step 1203). If $R_{NEW}$ has been less than the preset resistance value for a period of time greater than the preset period of time (step 1205), then the system controller 807 is preferably configured to follow a preset set of instructions (step 1109).

Figure 13:
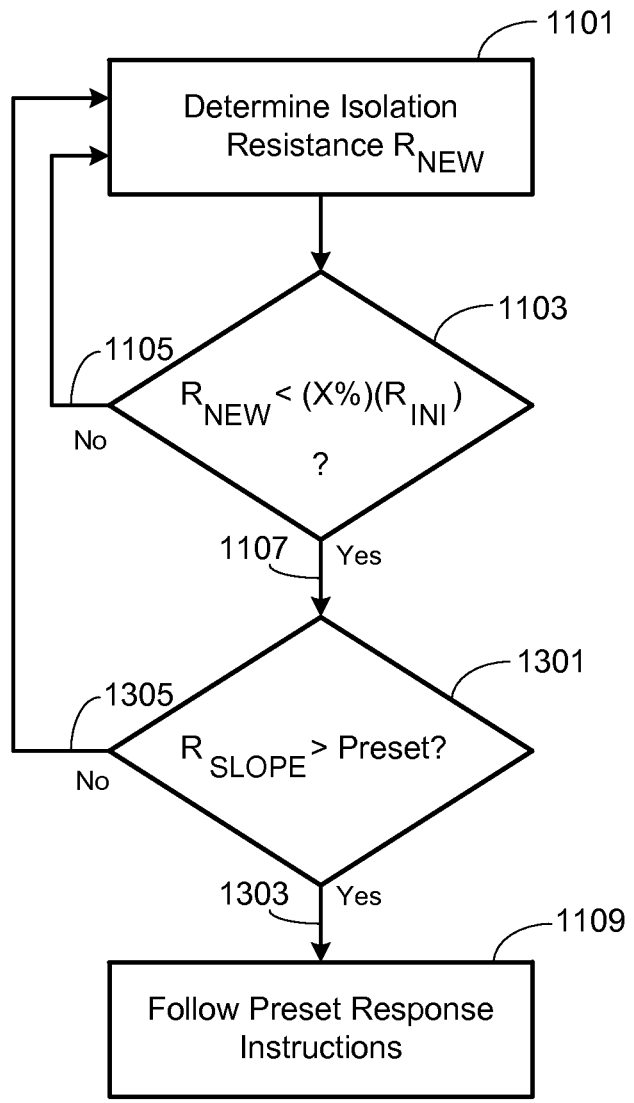
FIG. 13 illustrates an alternate method applicable to the invention.

In at least one embodiment of the invention, and as illustrated in FIG. 13, the system not only determines whether or not the isolation resistance is below a preset resistance value (step 1103), but also how quickly the isolation resistance has dropped below this value (step 1301). As previously noted, the inventor has found that upon the occurrence of a venting event, the drop in isolation resistance is quite rapid. Accordingly, in this embodiment of the invention the rate at which the drop in isolation resistance occurs, i.e., the slope of the falloff, is determined, thus providing a way of determining whether or not the change in isolation resistance is due to a cell failure or due to some other mechanism. If the measured isolation resistance, $R_{NEW}$, is less than the preset resistance value (step 1107) and the rate of change in the isolation resistance, $R_{SLOPE}$, is greater than the preset slope value (step 1303), then the system controller 807 is preferably configured to follow a preset set of instructions (step 1109). If the rate of change in the isolation resistance is less than the preset slope value (step 1305), the system may either continue to monitor isolation resistance as shown, or be configured to perform an alternate set of instructions, for example perform a set of diagnostics (not shown).

Figure 14:
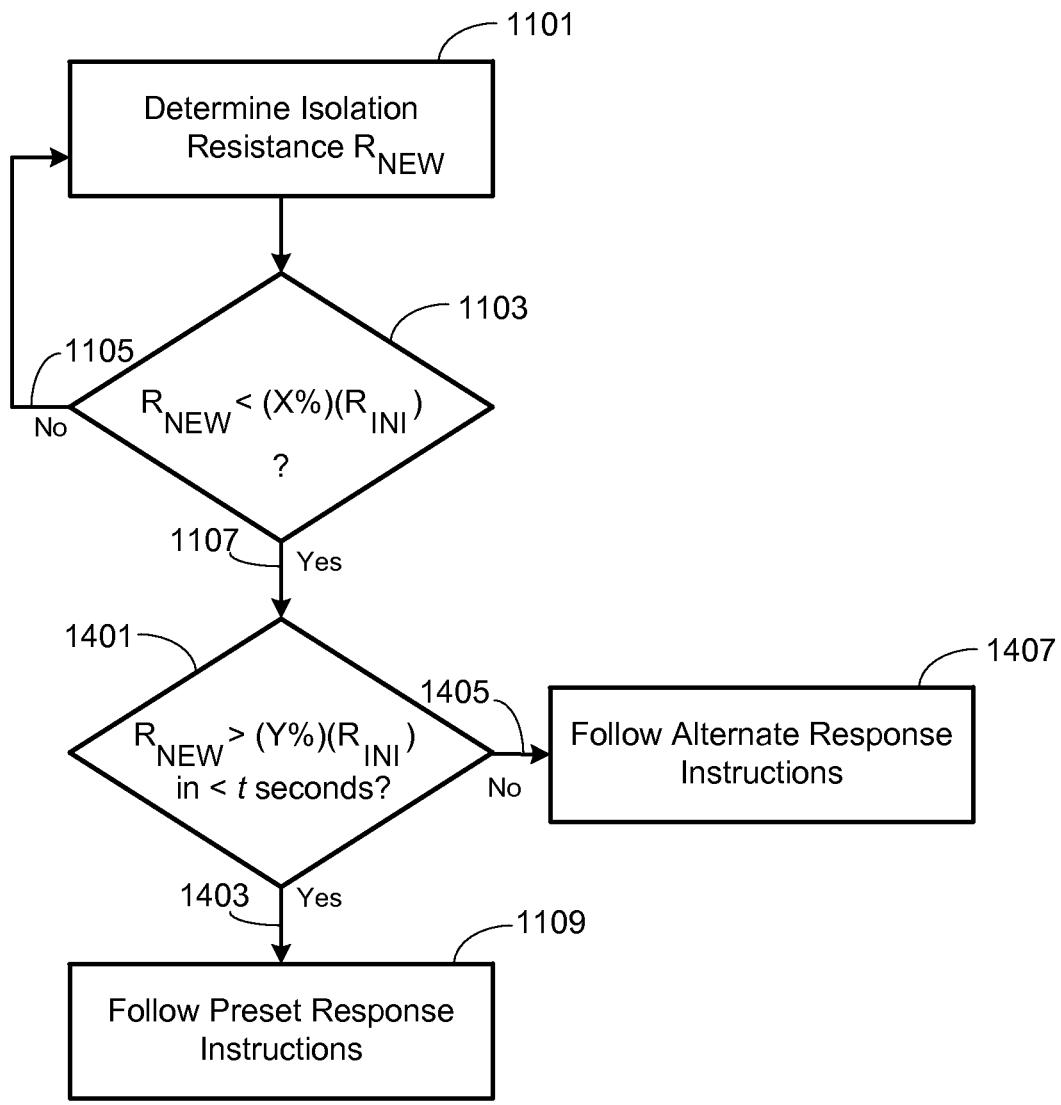
FIG. 14 illustrates an alternate method applicable to the invention.

In at least one embodiment of the invention, and as illustrated in FIG. 14, the system uses both the isolation resistance fall-off as well as the isolation resistance recovery cycle to determine whether or not a cell within the battery pack is failing. As shown in FIG. 14, if the measured isolation resistance, $R_{NEW}$, falls to a value that is less than the preset resistance value (step 1107), then the system goes on to determine if the isolation resistance recovers to a second preset value in less than t seconds (step 1401). The second preset value for the isolation resistance used in step 1401 may be set at the initial isolation resistance, $R_{INI}$, or it may be set to a different value as shown and preferred, i.e., $[(Y\%)(R_{INI})]$. Preferably the percentage used in step 1401, i.e., Y %, is set to be within the range of 50% to 95%, and more preferably within the range of 75% to 90%. Preferably the preset time period, t, is set to a value of less than 20 minutes, and more preferably to a value of less than 10 minutes, although other values may be used for t. If the battery pack isolation resistance recovers, i.e., exceeds $[(Y\%)(R_{INI})]$, within the preset time period (step 1403), then it is assumed that a cell has failed and the system controller 807 is preferably configured to follow the previously described preset set of instructions (step 1109). If the battery pack isolation resistance does not recover within the preset time period (step 1405), then the system controller may be configured to follow an alternate set of response instructions (step 1407). Response instructions 1407 may, for example, be a set of diagnostic tests intended to determine the cause of the changing isolation resistance, or may be a set of response instructions that assume that the cell is undergoing the second stage of venting, or may be a set of response instructions that assume that the cell has entered into thermal runaway, or may be a different set of response instructions.

Figure 15:
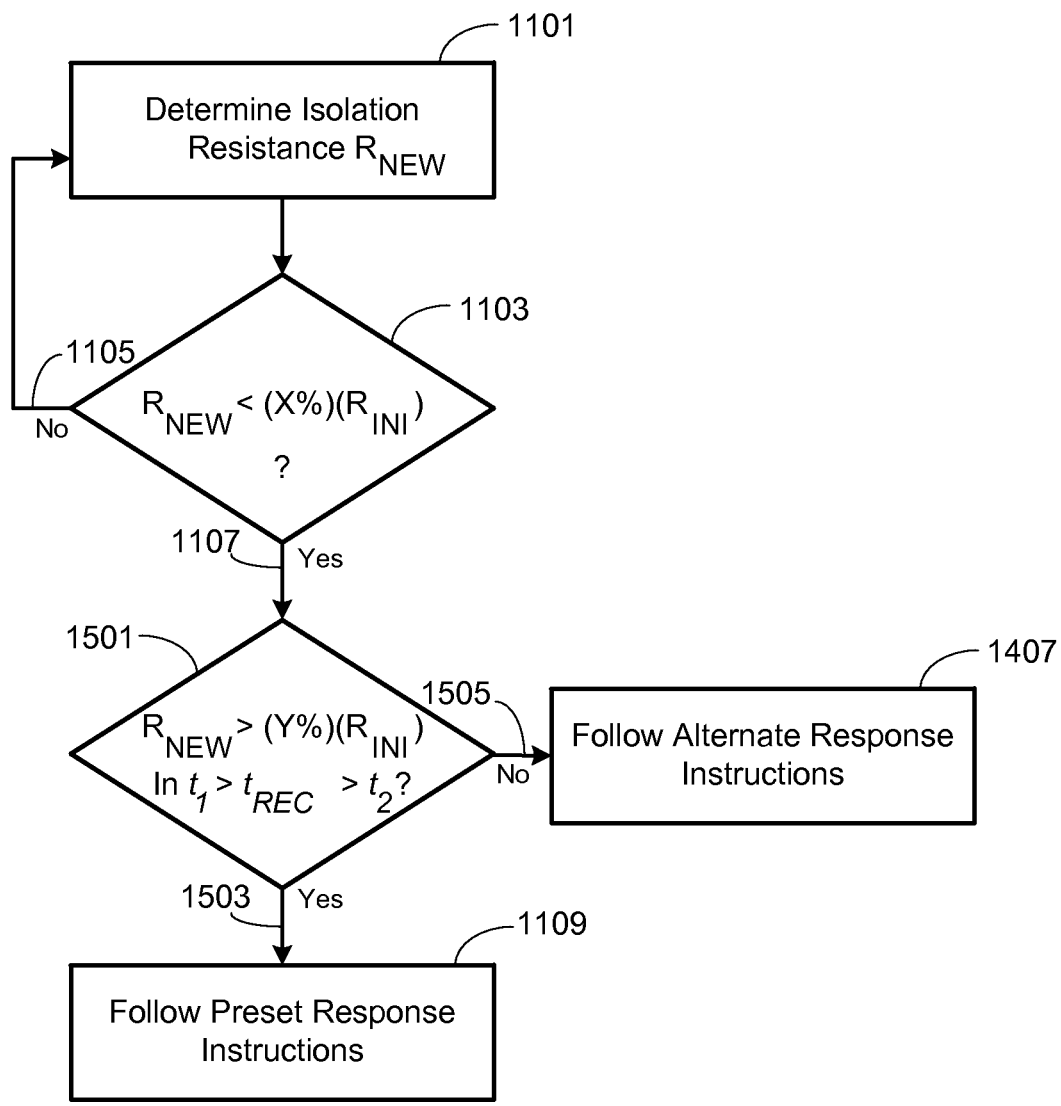
FIG. 15 illustrates an alternate method applicable to the invention.

In a modification of the previously described method, and as shown in FIG. 15, if the measured isolation resistance, $R_{NEW}$, falls to a value that is less than the preset resistance value (step 1107), then the system goes on to determine if the time period, $t_{REC}$, for the isolation resistance to recover to the second preset value is between a time $t_1$ and a time $t_2$ (step 1501). Preferably $t_1$ is less than 10 seconds, e.g., on the order of 3 seconds, 5 seconds or 10 seconds, and $t_2$ is on the order of 10 or 20 minutes. If the recovery time, $t_{REC}$, is between $t_1$ and $t_2$ (step 1503), then it is assumed that a cell has failed and the system controller 807 is preferably configured to follow the previously described preset set of instructions (step 1109). If the recovery time, $t_{REC}$, is not between $t_1$ and $t_2$ (step 1505), then the system controller may be configured to follow an alternate set of response instructions (step 1407). Response instructions 1407 may, for example, be a set of diagnostic tests intended to determine the cause of the changing isolation resistance, or may be a set of response instructions that assume that the cell is undergoing the second stage of venting, or may be a set of response instructions that assume that the cell has entered into thermal runaway, or may be a different set of response instructions.

As described above, when a cell fails it often undergoes multiple venting stages. Therefore in at least one embodiment of the invention, the disclosed method determines if there is evidence of both a first stage and a second stage of venting. It should be understood that the method may use any of the previously described techniques of determining the occurrence of the first and second venting stages. In general, the first stage is evidenced by a rapid fall-off in isolation resistance followed by a complete, or nearly complete, recovery cycle, while the second stage is evidenced by a rapid fall-off in isolation resistance which is not followed by a complete or nearly complete recovery. Typically the recovery during the second venting stage is on the order of, or less than, 50% recovery of the initial isolation resistance, $R_{INI}$.

Figure 16:
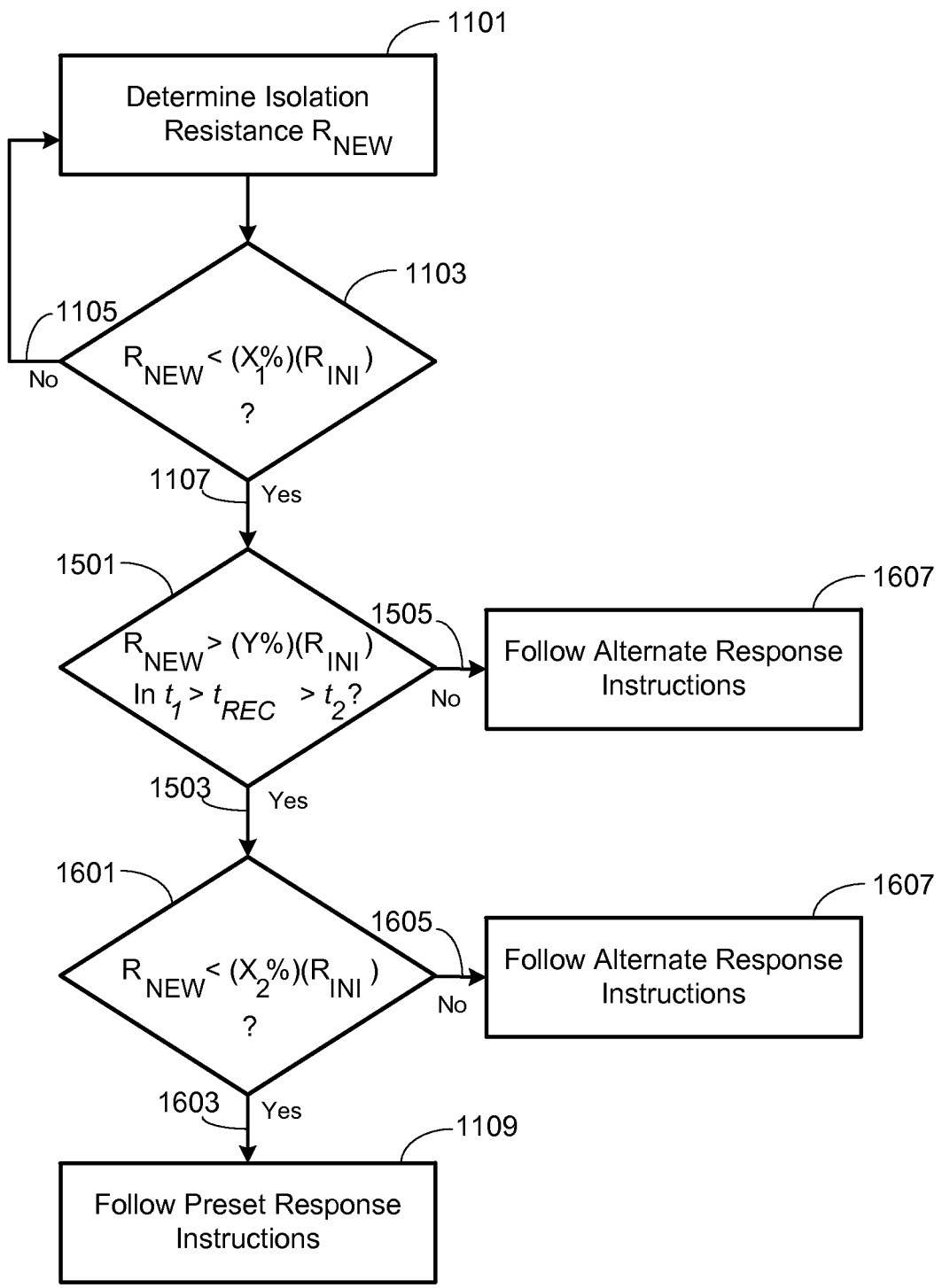
FIG. 16 illustrates an alternate method applicable to the invention.

FIG. 16 illustrates a method in which evidence of both the first and second venting stages is necessary before the system determines that a cell within the battery pack is failing and takes appropriate action. In the preferred embodiment of this method, after the measured isolation resistance, $R_{NEW}$, falls to a value that is less than the preset resistance value (step 1107), then the system goes on to determine if the time, $t_{REC}$, for the isolation resistance to recover to the second preset value is between a time $t_1$ and a time $t_2$ (step 1501). Preferably the percentage selected for $X_1$ is set to be within the range of 10% to 75%, and more preferably in the range of 25% to 50% or 10% to 25%. Preferably the percentage selected for Y is set to be within the range of 50% to 95%, and more preferably within the range of 75% to 90%. Preferably $t_1$ is less than 10 seconds, e.g., on the order of 3 seconds, 5 seconds or 10 seconds, and $t_2$ is on the order of 10 or 20 minutes. If the recovery time, $t_{REC}$, is between $t_1$ and $t_2$ (step 1503), then the system determines whether or not the isolation resistance has a second fall-off, preferably by comparing the measured isolation resistance, $R_{NEW}$, to a second preset resistance value (step 1601). The second preset resistance value can be the same as that used in step 1103, or different as indicated, i.e., $[(X_2\%)(R_{INI})]$. While $X_2$ may be different from $X_1$, preferably it is set to be within the range of 10% to 75%, and more preferably in the range of 25% to 50% or 10% to 25%. If the isolation resistance falls off again indicating a second venting stage (step 1603), then it is assumed that a cell has failed and the system controller 807 is preferably configured to follow the previously described preset set of instructions (step 1109). If, based on the monitored characteristics of the isolation resistance, it does not appear that a cell within the battery pack has failed and undergone multiple venting stages (i.e., steps 1505 or 1605), then the system controller may be configured to follow an alternate set of response instructions (step 1607). Alternate response instructions 1607 may, for example, be a set of diagnostic tests.

Figure 17:
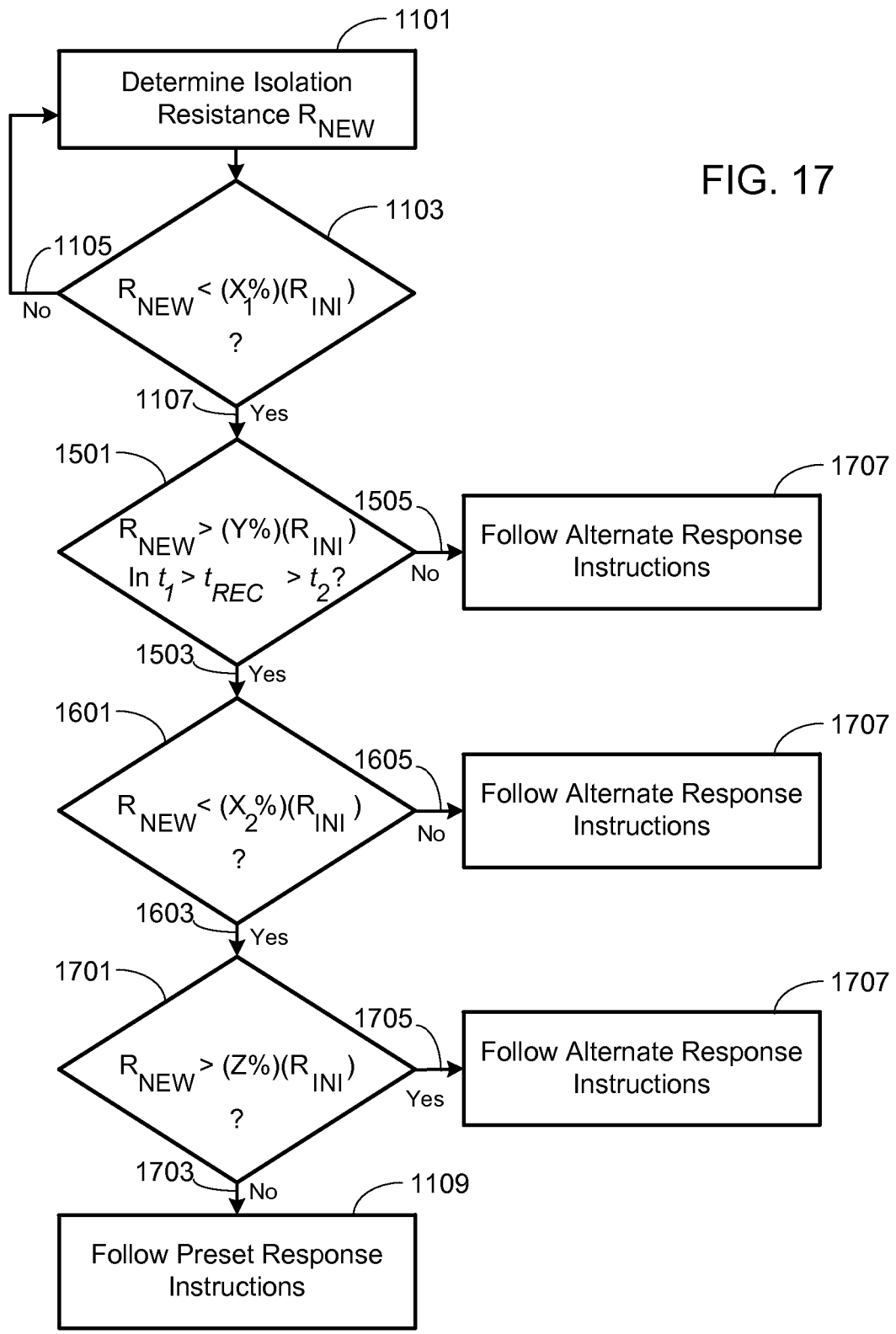
FIG. 17 illustrates an alternate method applicable to the invention.

FIG. 17 illustrates a minor modification of the methodology shown in FIG. 16. As shown, if in step 1601 the isolation resistance falls below the preset value, i.e., $[(X_2\%)(R_{INI})]$, then the system determines whether or not the isolation resistance recovers (step 1701). Recovery during the second venting stage is defined as the isolation resistance increasing to a value that is greater than a preset value, where the preset value, Z, is preferably selected to be between 25% and 100% of the initial isolation resistance, and more preferably selected to be between 40% and 75% of the initial isolation resistance. If the isolation resistance does not recover from the second venting stage (step 1703), then it is assumed that a cell has failed and the system controller 807 is preferably configured to follow the previously described preset set of instructions (step 1109). If, based on the monitored characteristics of the isolation resistance, it does not appear that a cell within the battery pack has failed and undergone multiple venting stages (i.e., steps 1505, 1605 or 1705), then the system controller may be configured to follow an alternate set of response instructions (step 1707). Alternate response instructions 1707 may, for example, be a set of diagnostic tests.

Figure 18:
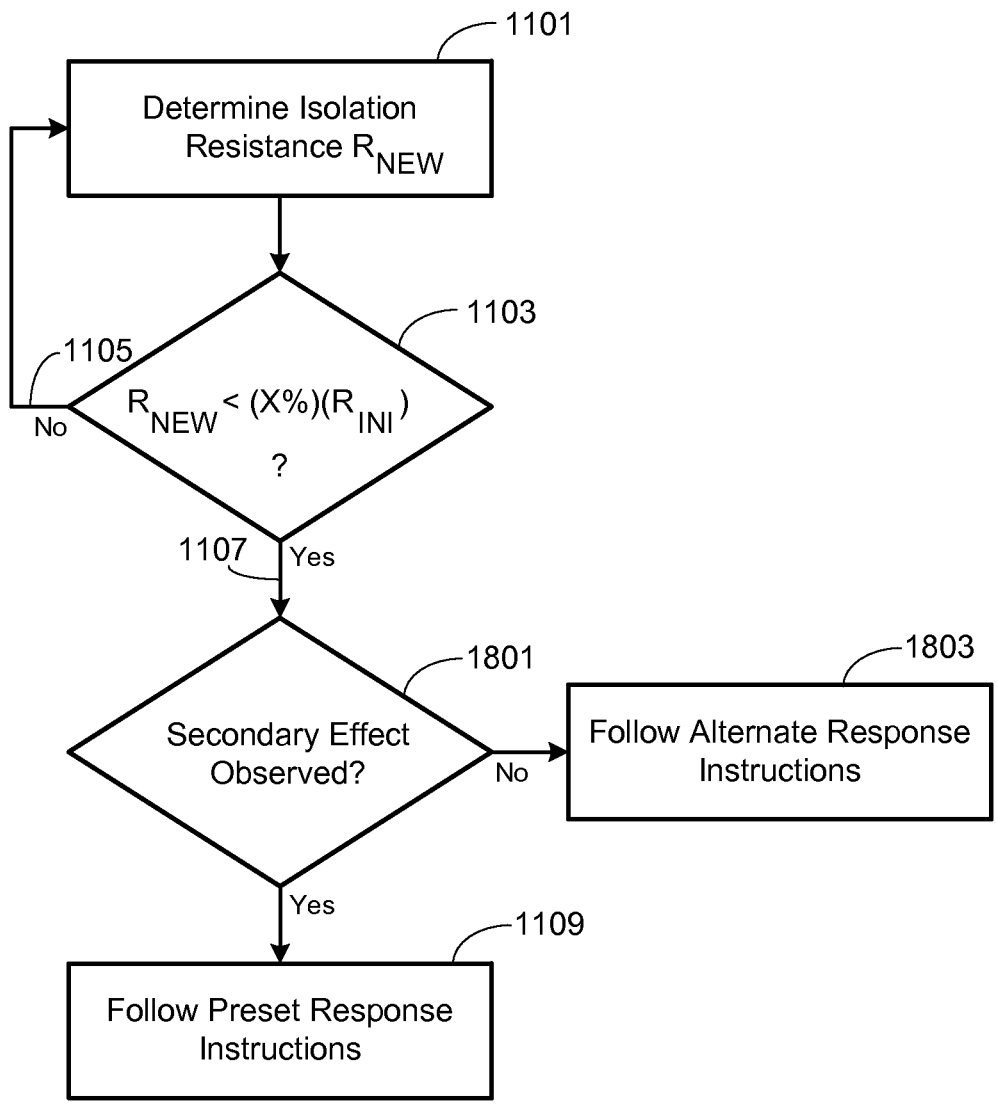
FIG. 18 illustrates an alternate method applicable to the invention.

Regardless of whether the system controller monitors for evidence of a first stage venting event, a second stage venting event, or both in determining whether or not a cell has failed, the system may also monitor for a secondary effect using monitoring system 805, thereby providing a means for potentially confirming the existence of a cell failure. As previously noted, secondary effects that may accompany a failing cell within a battery pack include, but are not limited to, (i) a loss of voltage chain continuity, (ii) a spike in battery pack temperature, (iii) a sudden increase in the relative humidity within the battery pack enclosure, and (iv) a spike in the monitored temperature of the coolant used to cool the battery cells/pack. The use of corroborating evidence by monitoring for a secondary effect(s) is illustrated in FIG. 18, which is based on the methodology shown in FIG. 11. In the method illustrated in FIG. 18, after the system determines that the isolation resistance of the battery pack has dropped below a preset value (step 1107), the system controller determines if there is secondary evidence of a cell failure (step 1801). Step 1801 may be comprised of the step of comparing the battery pack temperature to a preset temperature, where exceeding the preset temperature is evidence of a failing cell. Alternately, step 1801 may be comprised of the step of determining whether or not there has been a loss of voltage chain continuity. Alternately, step 1801 may be comprised of the step of comparing the humidity within the battery pack to a preset value, where exceeding the preset value is evidence of a cell undergoing venting. Alternately, step 1801 may be comprised of the step of comparing the temperature of the battery pack coolant to a preset temperature, where exceeding the preset temperature is evidence of a failing cell. If both the isolation resistance and the secondary effect provide evidence of at least one cell within the battery pack failing, then system controller 807 is preferably configured to follow the previously described preset set of instructions (step 1109). If both the isolation resistance and the secondary effect do not provide evidence of at least one cell within the battery pack failing, then the system controller may be configured to follow an alternate set of response instructions (step 1803). Alternate response instructions 1803 may, for example, be a set of diagnostic tests. Alternately, the system may be programmed to continue monitoring the isolation resistance and/or the secondary effect for further evidence of cell failure.

While the use of secondary effects has been discussed above with reference to a modification of the methodology of FIG. 11, it should be understood that the secondary effect may be used with any of the previously described methods (e.g., FIGS. 11-17) to provide secondary, corroborating evidence of cell failure. Furthermore it should be understood that the order in which evidence of cell failure is found, i.e., via changes in the isolation resistance or via a monitored secondary effect, is not critical to the invention. Thus, for example, steps 1103 and 1801 may be reversed.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A system for detecting cell failure within a battery pack, wherein the battery pack is comprised of a plurality of cells, the system comprising:
    an isolation resistance monitoring subsystem, wherein said isolation resistance monitoring subsystem monitors an electrical isolation resistance of said battery pack;
    a secondary effect monitoring subsystem that detects a secondary effect indicative of said cell failure, said secondary effect comprising at least an increase in battery pack temperature;
    a system controller coupled to said isolation resistance monitoring subsystem and to said secondary effect monitoring system, wherein said system controller detects when said electrical isolation resistance falls below a preset value, wherein said electrical isolation resistance falling below said preset value is indicative of said cell failure; and
    a cell failure response subsystem coupled to said system controller, wherein said cell failure response subsystem performs a first preset response upon receipt of a first control signal from said system controller, said first control signal transmitted by said system controller when said electrical isolation resistance falls below said preset value, provided that said secondary effect is detected by said secondary effect monitoring system, and wherein said cell failure response subsystem performs a second preset response upon receipt of a second control signal from said system controller, said second control signal transmitted by said system controller when said electrical isolation resistance falls below said preset value, provided that said secondary effect is not detected by said secondary effect monitoring system.

2. The system of claim 1, wherein said secondary effect monitoring subsystem monitors the battery pack temperature, and wherein said secondary effect corresponds to said battery pack temperature exceeding a preset temperature.

3. The system of claim 2, wherein said secondary effect monitoring subsystem is comprised of at least one temperature sensor mounted within said battery pack.

4. The system of claim 1, wherein said plurality of cells is segregated into at least a first plurality of cells and a second plurality of cells, wherein said battery pack is comprised of an enclosure and at least one electrically conductive segment in electrical communication with said enclosure, and wherein said at least one electrically conductive segment is interposed between said first and second pluralities of cells.

5. The system of claim 4, wherein said at least one electrically conductive segment is comprised of a combination of an electrically insulating member and an electrically conductive element, said electrically conductive element in electrical communication with said enclosure.

6. The system of claim 1, wherein said battery pack is comprised of an enclosure and a plurality of electrically conductive segments in electrical communication with said enclosure, and wherein said plurality of electrically conductive segments segregate said plurality of cells into a plurality of cell groups, wherein each cell group includes multiple cells.

7. The system of claim 6, wherein said at least one electrically conductive segment is comprised of a combination of an electrically insulating member and an electrically conductive element, said electrically conductive element in electrical communication with said enclosure.

8. The system of claim 1, wherein said cell failure response subsystem further comprises a warning indicator, and wherein said preset response comprises activating said warning indicator.

9. The system of claim 8, wherein said warning indicator is comprised of an indicator light.

10. The system of claim 8, wherein said warning indicator is comprised of a sound generator.

11. The system of claim 1, wherein said cell failure response subsystem further comprises a battery load controller, and wherein said preset response comprises reducing an electrical load on said plurality of cells of said battery pack.

12. The system of claim 1, wherein said cell failure response subsystem further comprises a battery load controller, and wherein said preset response comprises minimizing an electrical load on said plurality of cells of said battery pack.

13. The system of claim 1, further comprising a battery pack cooling system coupled to said cell failure response subsystem, and wherein said preset response comprises increasing cooling applied to said battery pack by said battery pack cooling system.

14. The system of claim 1, wherein said cell failure response subsystem further comprises a fire containment subsystem coupled to said battery pack, and wherein said preset response comprises activating said fire containment system.

15. The system of claim 1, further comprising a memory coupled to said system controller, and wherein said preset response comprises recording date and time information corresponding to said electrical isolation resistance falling below said preset value within said memory.

16. The system of claim 1, further comprising a communication and notification subsystem coupled to said system controller, and wherein said preset response comprises transmitting a notification message via said communication and notification subsystem.

17. The system of claim 1, wherein said isolation resistance monitoring subsystem monitors said electrical isolation resistance of said battery pack at a frequency of at least once per second.

18. The system of claim 1, further comprising another secondary effect monitoring subsystem that monitors another secondary effect.

19. The system of claim 18, wherein the other secondary effect is determined by monitoring transmission of light through an optical fiber incorporated into the battery pack.

20. The system of claim 18, wherein the other secondary effect is determined by monitoring electrical continuity of a thermally interruptible electrical conductor incorporated into the battery pack.

21. The system of claim 18, wherein the other secondary effect is determined by monitoring voltage of an insulated conductor incorporated into the battery pack.

* * * * *